United States Patent
Katoh et al.

(10) Patent No.: US 10,236,377 B2
(45) Date of Patent: Mar. 19, 2019

(54) SEMICONDUCTOR DEVICE

(71) Applicant: KABUSHIKI KAISHA TOSHIBA, Tokyo (JP)

(72) Inventors: Shunsuke Katoh, Komatsu Ishikawa (JP); Yusuke Kawaguchi, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,210

(22) Filed: Aug. 30, 2016

(65) Prior Publication Data

US 2017/0263768 A1 Sep. 14, 2017

(30) Foreign Application Priority Data

Mar. 11, 2016 (JP) ................................. 2016-048997

(51) Int. Cl.
*H01L 29/78* (2006.01)
*H01L 29/06* (2006.01)
(Continued)

(52) U.S. Cl.
CPC ...... *H01L 29/7827* (2013.01); *H01L 29/0692* (2013.01); *H01L 29/0696* (2013.01);
(Continued)

(58) Field of Classification Search
None
See application file for complete search history.

(56) References Cited

U.S. PATENT DOCUMENTS

| 7,518,183 B2 * | 4/2009 | Nakazawa | H01L 29/0619 257/330 |
| 2009/0114986 A1 * | 5/2009 | Hirler | H01L 29/404 257/334 |

(Continued)

FOREIGN PATENT DOCUMENTS

| JP | H01238174 A | 9/1989 |
| JP | H07142709 A | 6/1995 |

(Continued)

OTHER PUBLICATIONS

Japanese Office Action dated May 15, 2018, filed in Japanese counterpart Application No. 2016-048997, 12 pages (with translation)

*Primary Examiner* — Ali Naraghi
(74) *Attorney, Agent, or Firm* — Patterson & Sheridan, LLP

(57) ABSTRACT

A semiconductor device includes a first conductivity type first semiconductor region, a second semiconductor region on the first semiconductor region, a third semiconductor region on the second semiconductor region, a first insulating portion extending inwardly of, and surrounded by, the first semiconductor region, a gate electrode extending inwardly of the first insulating portion and spaced from the second semiconductor region in a second direction that intersects a first direction extending from the first semiconductor region to the second semiconductor region, by the first insulating portion, and a first electrode including a portion spaced from the first semiconductor region in the second direction by the first insulating portion, and surrounded by the first insulating portion and the gate electrode.

6 Claims, 15 Drawing Sheets

(51) Int. Cl.
  *H01L 29/10* (2006.01)
  *H01L 29/417* (2006.01)
  *H01L 29/423* (2006.01)
  *H01L 29/66* (2006.01)
  *H01L 29/40* (2006.01)

(52) U.S. Cl.
  CPC ........ *H01L 29/1095* (2013.01); *H01L 29/407* (2013.01); *H01L 29/41741* (2013.01); *H01L 29/4236* (2013.01); *H01L 29/4238* (2013.01); *H01L 29/42368* (2013.01); *H01L 29/66666* (2013.01); *H01L 29/66734* (2013.01); *H01L 29/7813* (2013.01)

(56) References Cited

U.S. PATENT DOCUMENTS

| | | | |
|---|---|---|---|
| 2011/0275210 A1* | 11/2011 | Denison | H01L 29/42368 438/589 |
| 2015/0137177 A1 | 5/2015 | Hutzler et al. | |
| 2015/0349113 A1 | 12/2015 | Katoh et al. | |
| 2016/0020321 A1* | 1/2016 | Cheng | H01L 21/2815 257/334 |

FOREIGN PATENT DOCUMENTS

| | | |
|---|---|---|
| JP | 2001102576 A | 4/2001 |
| JP | 2001203356 A | 7/2001 |
| JP | 200632598 A | 2/2006 |
| JP | 2015-225976 A | 12/2015 |

\* cited by examiner

SEMICONDUCTOR DEVICE

CROSS-REFERENCE TO RELATED APPLICATION

This application is based upon and claims the benefit of priority from Japanese Patent Application No. 2016-048997, filed Mar. 11, 2016, the entire contents of which are incorporated herein by reference.

FIELD

Embodiments described herein relate generally to a semiconductor device.

BACKGROUND

A semiconductor device such as a Metal Oxide Semiconductor Field Effect Transistor (MOSFET) is used for power conversion, and so on. It is desirable that the on resistance of a semiconductor device is low.

DETAILED DESCRIPTION

Figure 1:
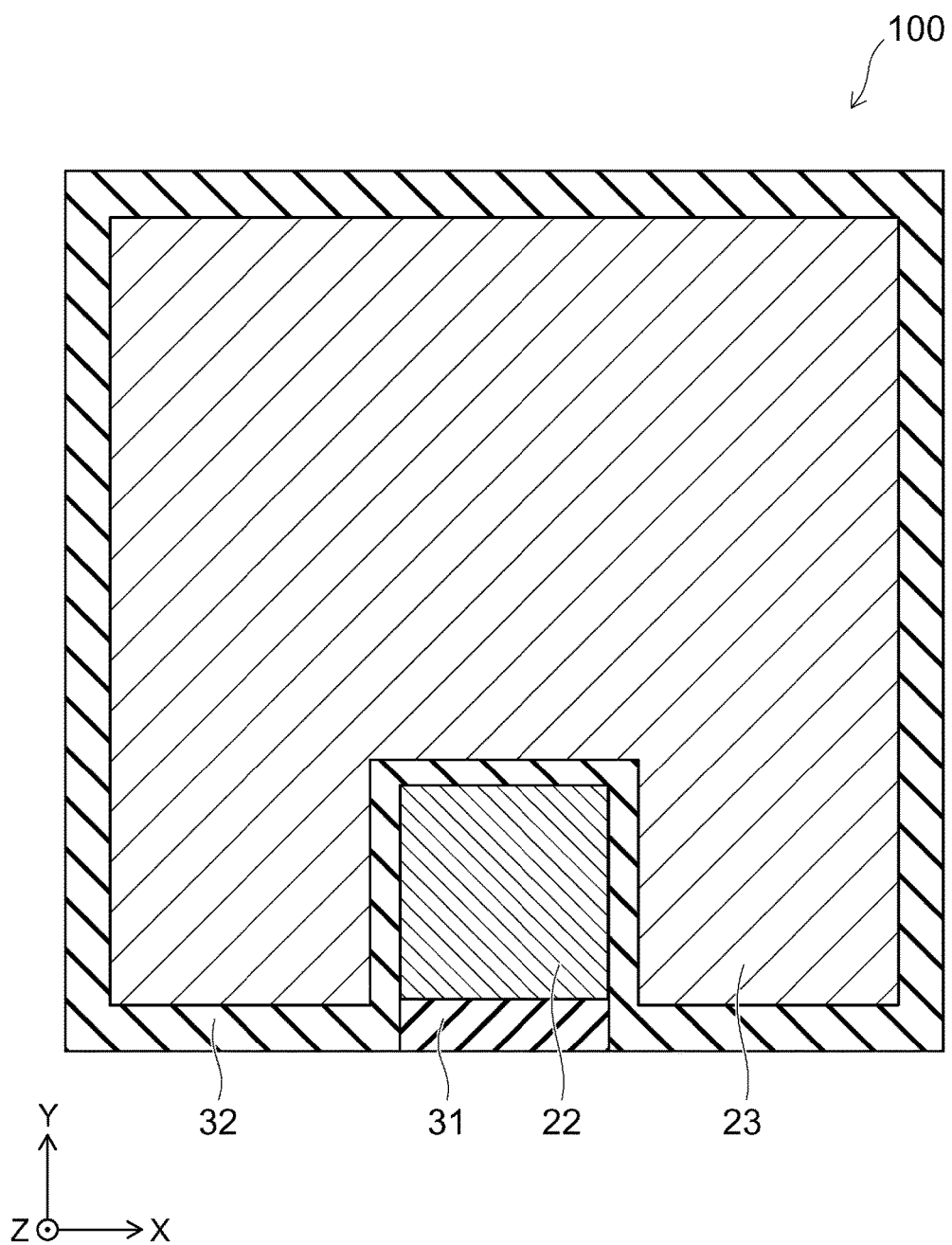
FIG. 1 is a top view illustrating a semiconductor device according to a first embodiment.

In general, according to one embodiment, a semiconductor device includes a first conductivity type first semiconductor region, a second conductivity type second semiconductor region on the first semiconductor region, a first conductivity type third semiconductor region on the second semiconductor region, a first insulating portion extending inwardly of, and surrounded by, the first semiconductor region, a gate electrode extending inwardly of the first insulating portion and spaced from the second semiconductor region in a second direction that intersects a first direction extending from the first semiconductor region to the second semiconductor region, by the first insulating portion, and a first electrode including a portion spaced from the first semiconductor region in the second direction by the first insulating portion, and surrounded by the first insulating portion and the gate electrode.

Hereinafter, embodiments will be described with reference to the drawings.

The drawings are schematic and conceptual, and the relation between the thicknesses and widths of respective portions, ratios between the sizes of the portions, and the like may not be the same as those of an actual device. Even for the same elements, dimensions or ratios may be sometimes different depending on the drawings.

In this specification and the drawings, where the same reference numerals and symbols are given to elements which are the same as those already described, a detailed description thereof will not be repeated.

In the description of the embodiments, the XYZ orthogonal coordinate system is used. A direction from an $n^-$ type semiconductor region 1 to a p type base region 2 will be referred to as a Z direction (first direction), and two directions perpendicular to the Z direction and orthogonal to each other are referred to as the X direction (third direction) and the Y direction (second direction).

In the following description, notations of $n^+$, $n^-$, and p indicate relative magnitude of impurity concentration in conductivity types. That is, a type notation with "+" means an impurity concentration relatively higher than notation without a "+" or a "−" and an impurity type notation with "−" means an impurity concentration relatively lower than an impurity type notation without a "+" or a "−".

In embodiments to be described below, a p type and an n type of respective semiconductor regions may be reversed to carry out the embodiments.

First Embodiment

An example of a semiconductor device according to the first embodiment will be described with reference to FIGS. 1 to 3.

Figure 2:
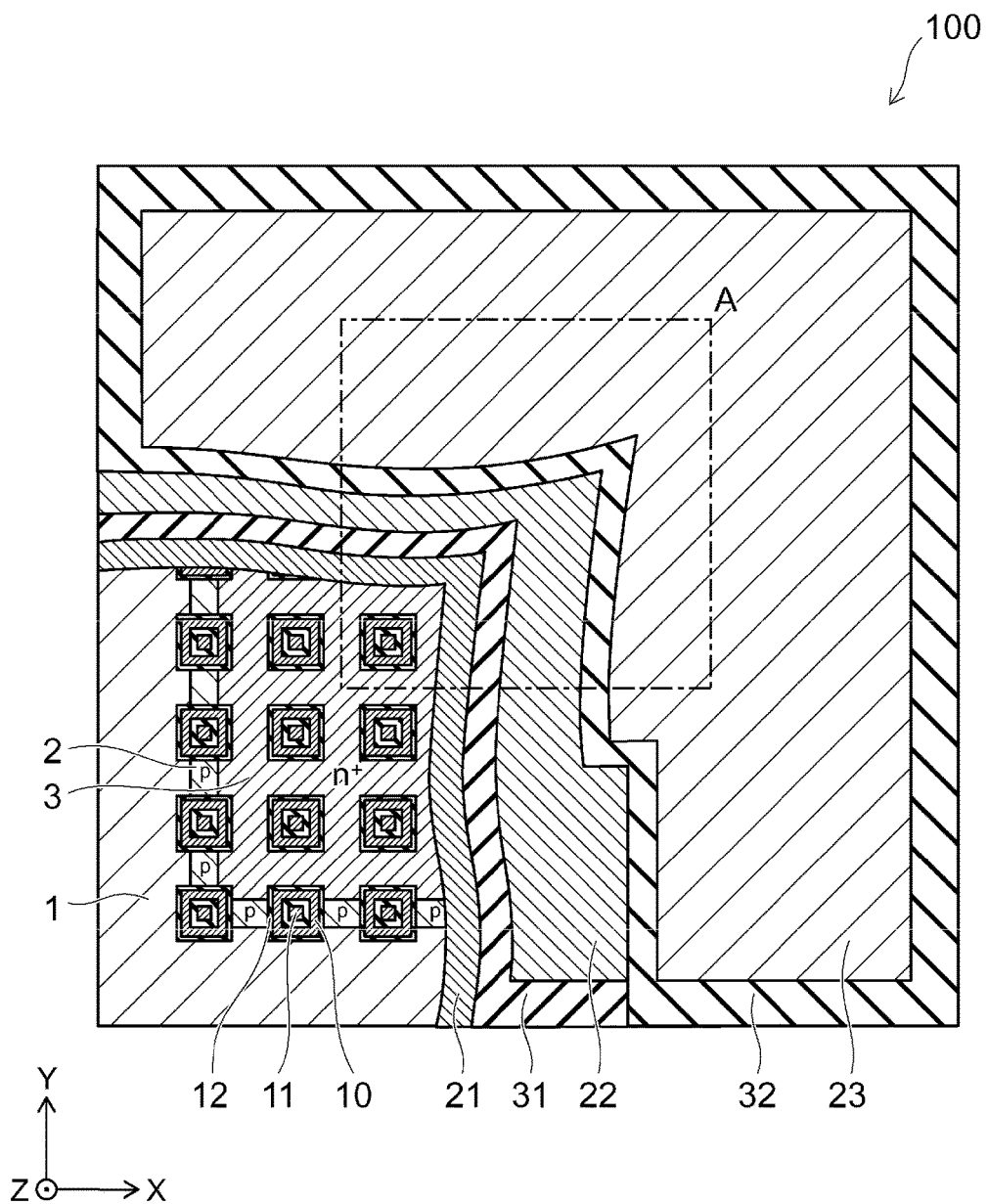
FIG. 2 is a top view illustrating the semiconductor device according to the first embodiment.

FIGS. 1 and 2 are top views of a semiconductor device 100 according to a first embodiment.

Figure 3:
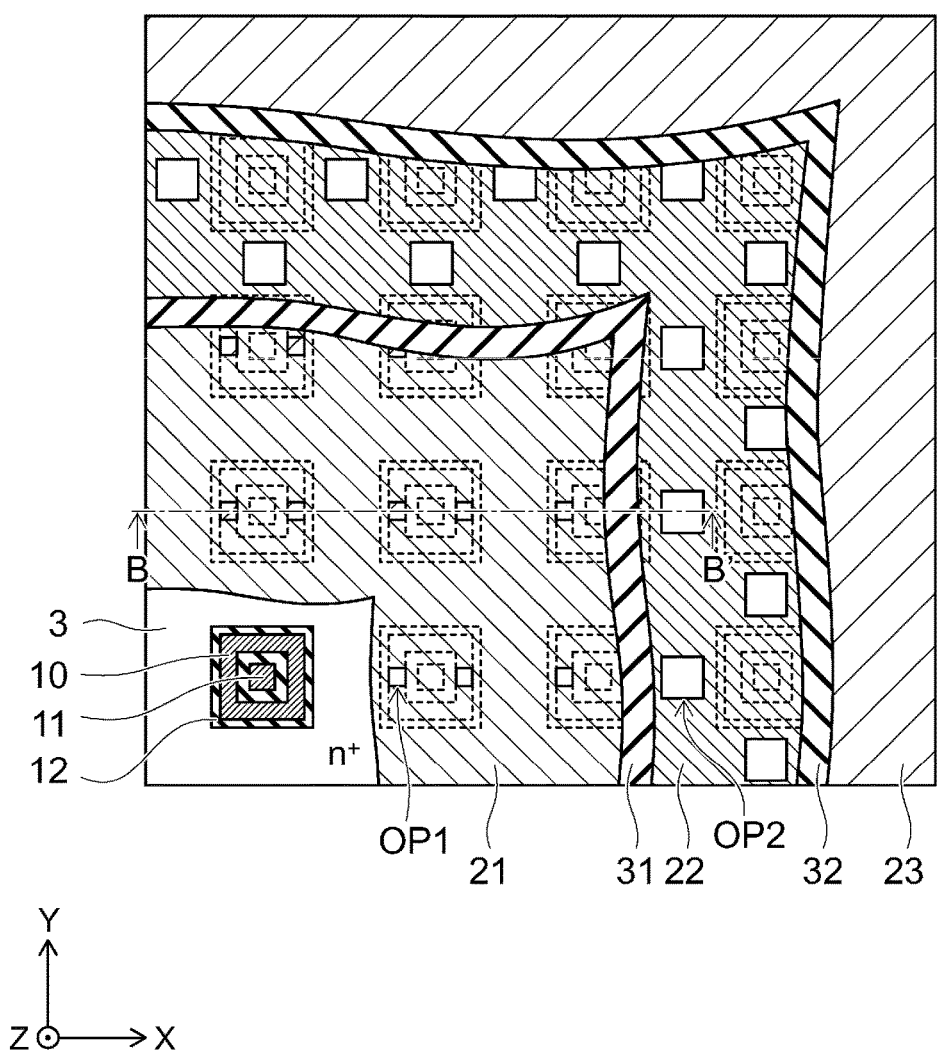
FIG. 3 is a top view illustrating a portion A of FIG. 2 in an enlarged manner.

FIG. 3 is a top view illustrating a portion A of FIG. 2 in an enlarged manner.

Figure 4:
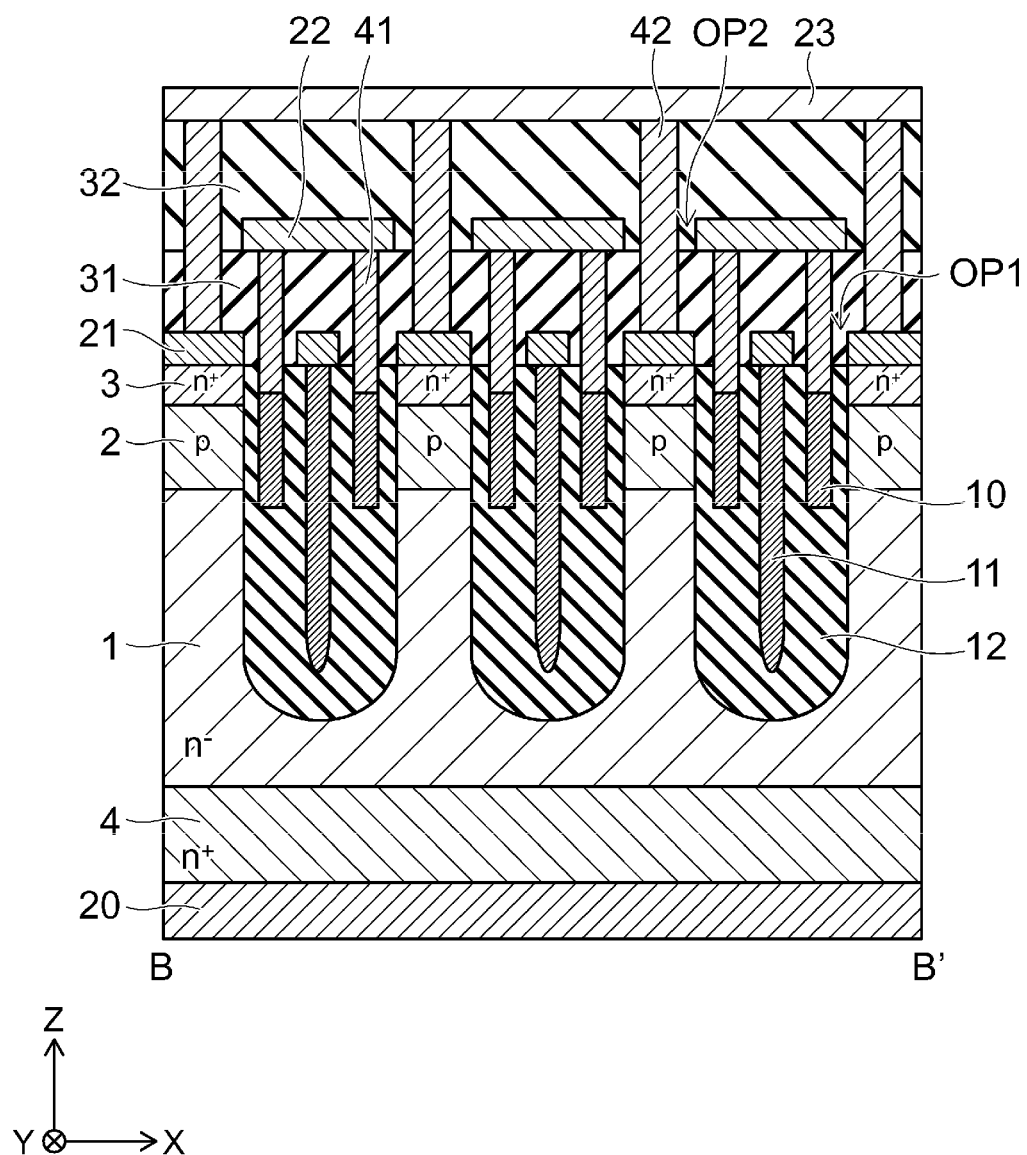
FIG. 4 is a cross sectional view taken along line B-B' of FIG. 3.

FIG. 4 is a cross sectional view taken along line B-B' of FIG. 3.

In FIGS. 2 and 3, overlying portions of a source electrode 21, an insulating layer 31, a gate pad 22, an insulating layer 32, and a source pad 23 are not illustrated for the purpose of explaining the interior structure of the semiconductor device 100.

In FIG. 2, an opening OP1 of the source electrode 21, and an opening OP2 of the gate pad 22 are also not illustrated.

In FIG. 3, the gate electrode 10, an FP electrode 11 and an insulating portion 12, which are provided under the source electrode 21 and the gate pad 22, are indicated by a broken line.

The semiconductor device 100 is a Metal Oxide Semiconductor Field Effect Transistor (MOSFET).

As illustrated in FIGS. 1 to 4, the semiconductor device 100 includes an $n^-$ type (first conductivity type) semiconductor region 1 (first semiconductor region), a p type (second conductivity type) base region 2 (second semiconductor region), an $n^+$ type source region 3 (third semiconductor region), an $n^+$ type drain region 4, gate electrodes 10, field plate electrodes 11 (hereinafter, referred to as an FP electrode) (first electrode), insulating portion 12 (first insulating portion), drain electrode 20, source electrode 21 (first metal layer), gate pad 22 (second metal layer), source pad 23 (third metal layer), insulating layer 31 (first insulating layer), insulating layer 32 (second insulating layer), plug 41 (first connection portion), and plug 42 (second connection portion).

As illustrated in FIG. 1, a portion of the gate pad 22 and the source pad 23 are exposed at the upper surface of the semiconductor device 100. The remaining portion of the gate pad 22 is covered by the insulating layer 32 and the source pad 23.

As illustrated in FIG. 2, the insulating layer 31 is provided under the gate pad 22, and the source electrode 21 is provided under the insulating layer 31. The gate electrodes 10 and the FP electrodes 11 are provided under the source electrode 21 and are spaced apart in the Y direction and in the X direction.

As illustrated in FIGS. 2 and 3, the portions of the gate electrodes 10 and the FP electrodes 11 extending inwardly of the n$^-$ type semiconductor region 1, the p type base region 2 and the n$^+$ type source region 3 are surrounded by the insulating portion 12. Further, the gate electrodes 10 are formed in an annular shape, and the FP electrodes 11 are provided within perimeter of the gate electrodes 10. In the embodiment the annular shape is square.

As illustrated in FIG. 3, the source electrode 21 includes a plurality of openings OP1 (first openings) extending therethrough. Pairs of the openings OP1 are provided above spaced apart portions of one of the gate electrodes 10.

The gate pad 22 includes a plurality of openings OP2 (second openings) extending therethrough. The openings OP2 are provided above, for example, the n$^+$ type source region 3 and located so as not to overlie the openings OP1 in the Z direction. Further, the width (i.e., the opening dimension in the X direction and/or Y direction) of the openings OP2 is greater than the width of the openings OP1.

As illustrated in FIG. 4, the drain electrode 20 is provided on a lower surface of the semiconductor device 100.

The n$^+$ type drain region 4 is provided on the drain electrode 20 and is electrically connected to the drain electrode 20.

The n$^-$ type semiconductor region 1 is provided on the n+ type drain region 4.

The p type base region 2 is provided on the n$^-$ type semiconductor region 1.

The n$^+$ type source region 3 is provided on the p type base region 2.

Each insulating portion 12 is provided along the sides and base of an opening into the n$^-$ type semiconductor region 1, and is surrounded by the n$^-$ type semiconductor region 1, the p type base region 2 and the n$^+$ type source region 3.

The gate electrodes 10 are arranged side by side with the p type base region 2 in the X direction and the Y direction and extend inwardly of the insulating portion 12. The FP electrodes 11 extend further into the insulating portion 12 than do the gate electrodes 10 such that the insulating portion 12 is interposed between portions of the FP electrodes 11 and the n$^-$ type semiconductor region 1 in the X direction and the Y direction.

A portion of the insulating portion 12 is also provided between the gate electrodes 10 and the FP electrodes 11 such that these electrodes are electrically isolated from each other.

The source electrode 21 is provided on the n$^+$ type source region 3 and the insulating portion 12, and is electrically connected to the n$^+$ type source region 3 and the FP electrode 11.

As described above, the insulating layer 31, the gate pad 22, the insulating layer 32, and the source pad 23 are stacked in this order over the source electrode 21.

The plug 41 is provided extending through the insulating layer 31, and connects the gate pad 22 and the gate electrodes 10 through the openings OP1 of the source electrode 21.

The plug 42 is provided extending through the insulating layer 31 and the insulating layer 32, and connects the source pad 23 and the source electrode 21 through the openings OP2 of the gate pad 22.

Herein, an operation of the semiconductor device 100 will be described.

While a positive voltage is being applied to the drain electrode 20 with respect to the source electrode 21, when a voltage equal to or greater than a threshold voltage is applied to the gate electrodes 10, the semiconductor device is turned on. At this time, a channel (inverse layer) is provided in a region of the p type base region 2 close to the insulating portion 12.

Then, when the voltage being applied to the gate electrodes 10 is decreased below the threshold voltage, the channel disappears and the semiconductor device is turned off.

When the semiconductor device is in off state, the potential difference between the FP electrodes 11 (connected to the source electrode 21) and the drain electrode 20 causes a depletion layer to expand from the interface between the insulating portion 12 and the n$^-$ type semiconductor region 1 into the n$^-$ type semiconductor region 1. The depletion layer expanding from the interface between the insulating portion 12 and the n$^-$ type semiconductor region 1 increases the breakdown voltage of the semiconductor device. Alternatively, the n type impurity concentration in the n$^-$ type semiconductor region 1 can be increased while the breakdown voltage of the semiconductor device is maintained, and the on resistance of the semiconductor device is thus decreased.

Examples of materials for the respective components will be described below.

The n$^+$ type drain region 4, the n$^-$ type semiconductor region 1, the p type base region 2, and the n$^+$ type source region 3 include silicon, silicon carbide, gallium nitride, or gallium arsenide as semiconductor materials. When single crystal silicon is used as the semiconductor material, as the n type impurity to be added to the semiconductor material, arsenic, phosphor or antimony may be used. Boron may be used as the p type impurity.

The gate electrodes 10 and the FP electrodes 11 are a conductive material such as polysilicon, doped polysilicon, and so on.

The insulating portion 12, the insulating layer 31, and the insulating layer 32 are an insulating material such as silicon oxide, silicon nitride, and so on.

The drain electrode 20, the source electrode 21, the gate pad 22 and the source pad 23 are metal layers including a metal such as aluminum, and so on.

The plugs 41, 42 are a metal such as titanium or tungsten, and so on. Alternatively, the plugs 41, 42 may have a stack structure of a first portion including titanium or tungsten and a second portion including aluminum.

Next, an example of a fabricating method of the semiconductor device 100 according to the first embodiment will be described with reference to FIGS. 5A to 7B.

FIGS. 5A to 7B are cross sectional views illustrating the result of a fabrication process of the semiconductor device 100 on a semiconductor substrate 100 according to the first embodiment.

First, a semiconductor substrate with an n$^+$ type semiconductor layer 4a and an n$^-$ type semiconductor layer 1a is prepared. Next, a p type impurity is injected into the surface of the n⁻ type semiconductor layer 1a by ion implantation to form a p type base region 2. A plurality of openings extending through the p type base region 2 are then formed.

Figure 5A:
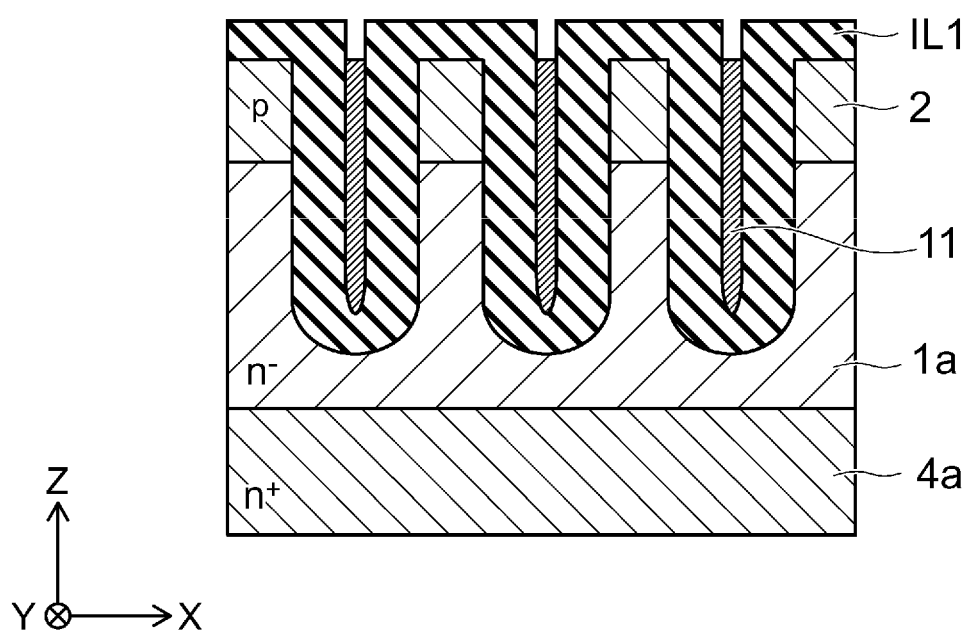
FIGS. 5A and 5B are cross sectional views illustrating a fabricating process of the semiconductor device according to the first embodiment.

Next, an insulating layer IL1 is formed along inner walls and base of the openings. A conductive layer is then formed on the insulating layer IL1. By etching-back the upper portion of the conductive layer, the FP electrodes 11 are formed in the respective openings, as illustrated in FIG. 5A.

Figure 5B:
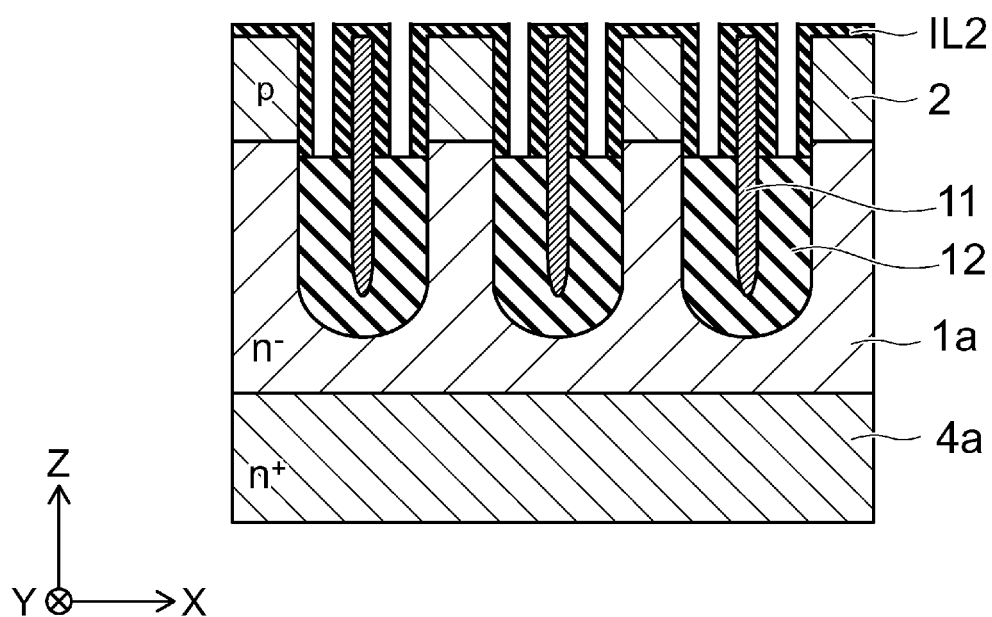

Next, the portion of the insulating layer IL1 around the upper portion of the FP electrodes 11 is removed. Accordingly, the upper portion of the FP electrodes 11 and the surface of the semiconductor layer 2 are exposed. As illustrated in FIG. 5B, an insulating layer IL2 is then formed on the exposed portions by thermal oxidation of the surface of the semiconductor layer.

Figure 6A:
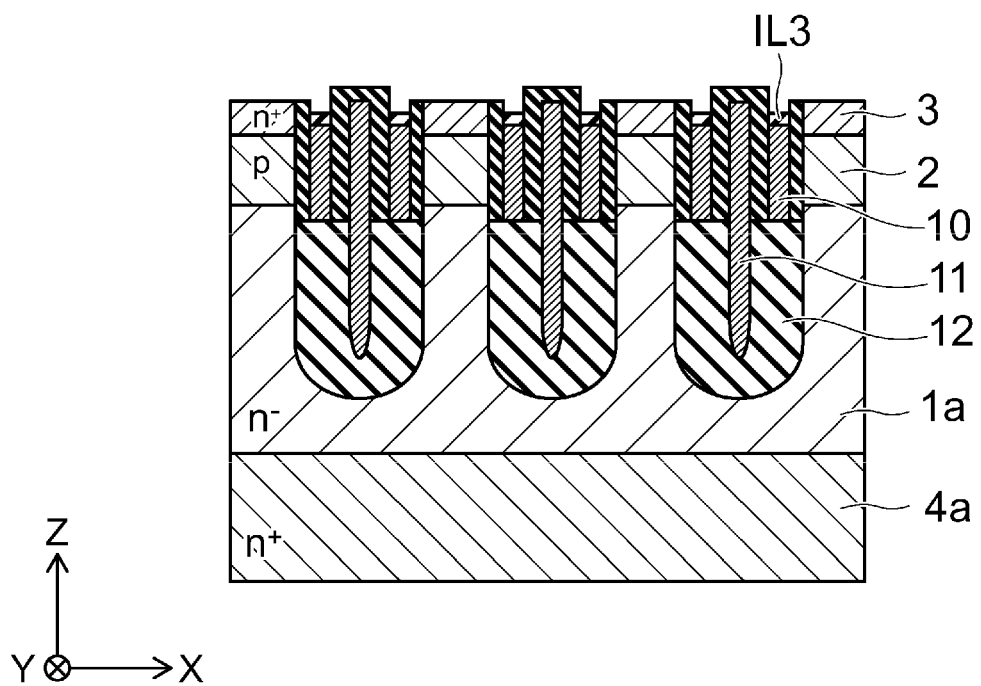
FIGS. 6A and 6B are cross sectional views illustrating the fabricating process of the semiconductor device according to the first embodiment.

Next, a conductive layer is formed on the insulating layer IL2, and the gate electrodes 10 are formed around the upper portion of the FP electrodes 11 by etching-back the conductive layer. Then by performing thermal oxidation of the exposed portion of the etched back conductive layer, an insulating layer IL3 is formed on the upper surface of the gate electrodes 10. Then as illustrated in FIG. 6A, an n type impurity is ion-implanted into the surface of the p type base region 2 such that n⁺ type source region 3 is formed.

Figure 6B:
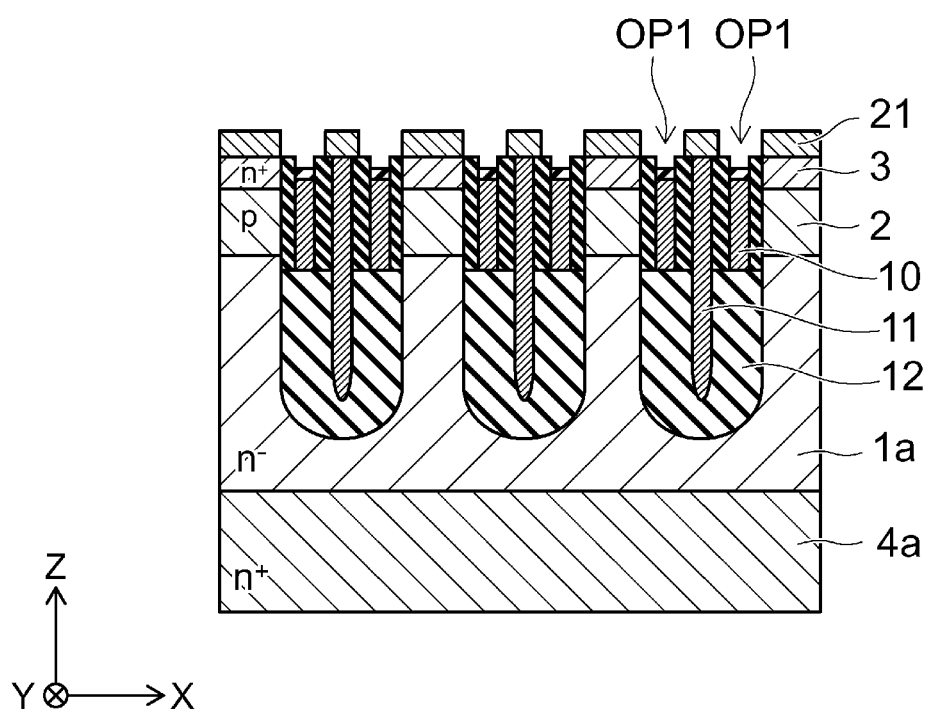

Next, a portion of the insulating layer IL2 is removed, thus exposing the n⁺ type source region 3 and upper surfaces of the FP electrodes 11. Then a metal layer is formed thereon. By patterning the metal layer, the source electrode 21 having a plurality of openings OP1 is formed as illustrated in FIG. 6B.

Figure 7A:
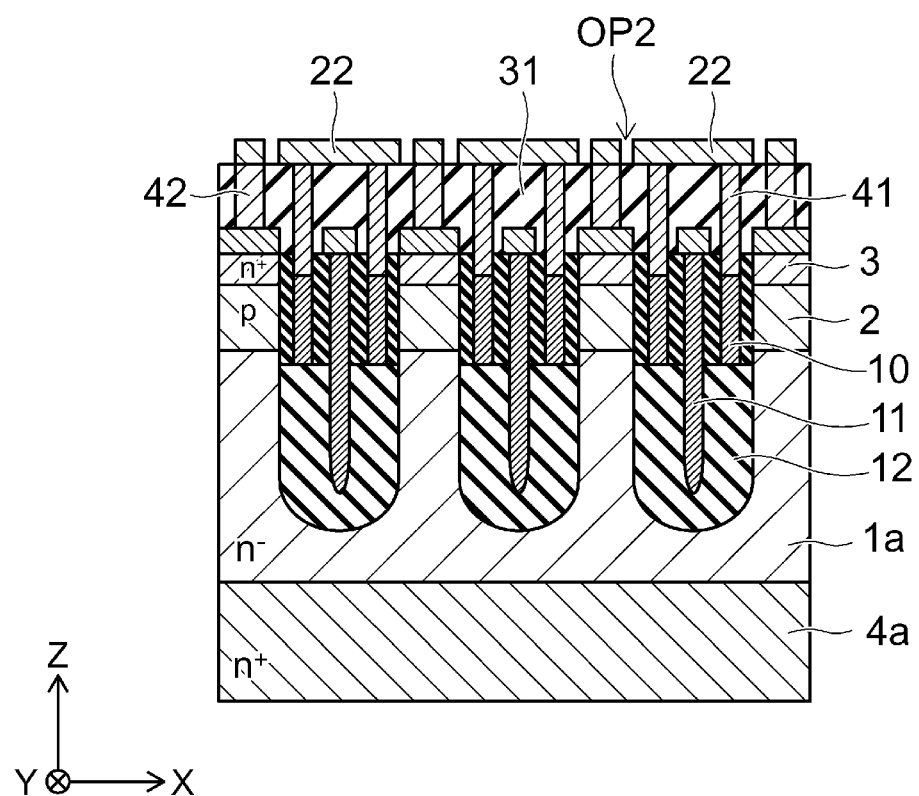
FIGS. 7A and 7B are cross sectional views illustrating the fabricating process of the semiconductor device according to the first embodiment.

Next, the insulating layer 31 is formed on the source electrode 21, and a plurality of openings are formed in the insulating layer 31. The upper surface of the gate electrodes 10 and the upper surface of the source electrode 21 are exposed through openings formed in the insulating layer 31. Then the openings formed in the insulating layer 31 are filled with the metal material. As a result, the plug 41 and a portion of the plug 42 are formed extending through the insulating layer 31. Then a metal layer is formed on the insulating layer 31. By patterning the metal layer, the gate pad 22 having a plurality of openings OP2 is formed as illustrated in FIG. 7A.

Figure 7B:
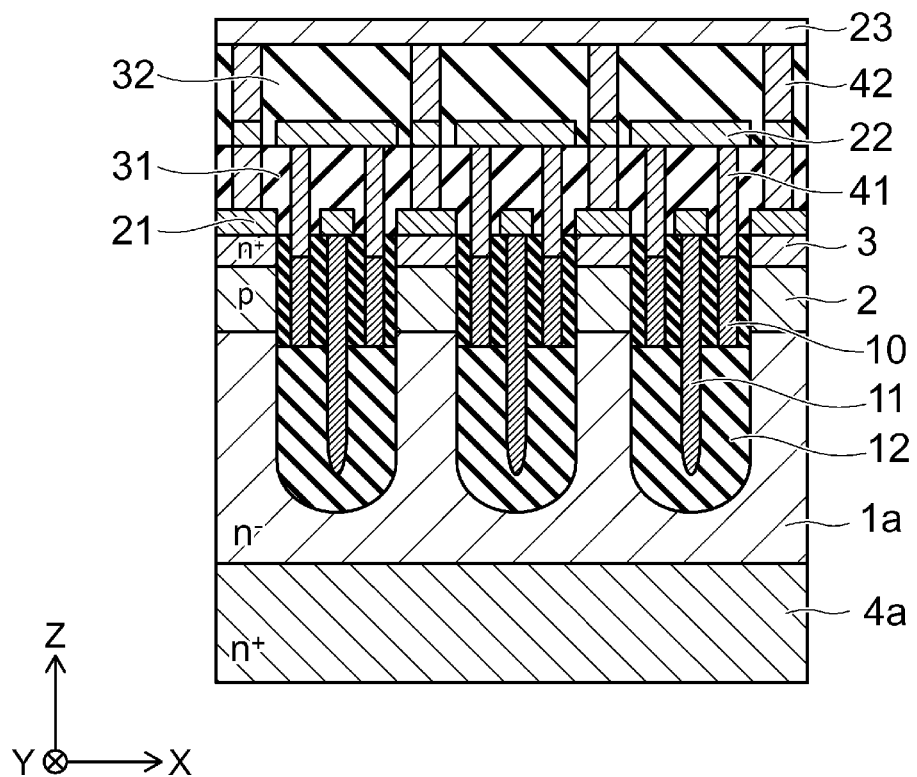

Next, the insulating layer 32 is formed on the gate pad 22, and a plurality of openings are formed in the insulating layer 32. Then the openings formed in the insulating layer 32 are filled with the metal material. Accordingly, the remaining portion of plug 42 is formed in the insulating layer 32. Then the metal layer is formed on the insulating layer 32. By patterning the metal layer, the source pad 23 is formed as illustrated in FIG. 7B.

Next, a rear surface of the n⁺ type semiconductor layer 4a is polished until the n⁺ type semiconductor layer 4a has a predetermined thickness. Next, by forming the drain electrode 20 on the rear surface of the n⁺ type semiconductor layer 4a, the semiconductor device 100 as illustrated in FIGS. 1 to 4 is obtained.

In the example of the fabricating method illustrated in FIGS. 5A to 7B, a plurality of metal layers are stacked in the Z direction, to thereby form the plug 42. However, the present disclosure is not limited to any of these methods. Accordingly, the plug 42 may be formed by forming the insulating layer 32, then forming the openings extending through the insulating layers 31 and 32, and then filling the openings with the metal material.

Herein, an operation and an effect of this embodiment will be described.

In the semiconductor device according to this embodiment, the plurality of gate electrodes 10 are provided spaced apart in the X direction and the Y direction, with each of the gate electrodes 10 being surrounded by the insulating portion 12 and the p type base region 2. When the semiconductor device has the configuration as described above, an annular-shaped channel is formed in the p type base region 2 around the insulating portion 12 with the application of a voltage to the gate electrode 10. Accordingly, compared to when the gate electrodes 10 extend in either X direction or Y direction, the channel density, that is, the area of the channel per unit area of the semiconductor device can be enhanced.

In the semiconductor device according to this embodiment, because the FP electrodes 11 are provided and depletion is facilitated in the n⁻ type semiconductor region 1, the n type impurity concentration in the n⁻ type semiconductor region 1 can be increased, while the breakdown voltage of the semiconductor device is maintained.

Moreover, the FP electrodes 11 are provided within annulus of the gate electrodes 10, and the FP and gate electrodes 10, 11 are surrounded by the insulating portion 12. By employing such a structure, compared to when the gate electrodes 10 and the FP electrodes 11 are provided in separate insulating portions, it is possible to form the gate electrodes 10 and the FP electrodes 11 at higher density and to further enhance the channel density of the semiconductor device.

That is, according to this embodiment, it is possible to increase the n type impurity concentration in the n⁻ type semiconductor region 1, enhance the channel density of the semiconductor device, and decrease the on resistance of the semiconductor device.

Further, since the gate electrodes 10 are provided in an annular shape around the FP electrodes 11, as represented in the fabricating process of FIGS. 5A to 7B, the gate electrodes 10 may be formed in self-alignment around the locations at which the FP electrodes 11 are formed.

As a result, the semiconductor device and the fabricating method thereof according to this embodiment can suppress differences in relative locations between the gate electrodes 10 and the FP electrodes 11, and enhance the product yield of the resulting semiconductor devices.

Further, because the source electrode 21 is provided over the n⁺ type source region 3 such that the n⁺ type source region 3 and the source electrode 21 are connected, compared to the case where the source pad 23 and the n⁺ type source region 3 are directly connected with the plug, the contact area between the metal layer connected to the source potential and the n⁺ type source region 3 can be increased. The increased contact area can alleviate the deviations of the current density in the p type base region 2 and the n⁺ type source region 3, and when the semiconductor device is in on state, it is possible to allow a larger current to flow to the semiconductor device.

In the semiconductor device according to this embodiment, the gate pad 22 and the source pad 23 are stacked, the gate pad 22 and the gate electrodes 10 are connected to each other by the plug 41, and the source pad 23 and the FP electrodes 11 are connected to each other by the plug 42. By employing the structure as described above, even when a plurality of gate electrodes 10 and a plurality of FP electrodes 11 are located spaced apart in the X direction and Y direction, the gate pad 22 and the gate electrodes 10 can be easily connected to each other and the source pad 23 and the FP electrodes 11 can be easily connected to each other.

First Modification Example

Figure 8:
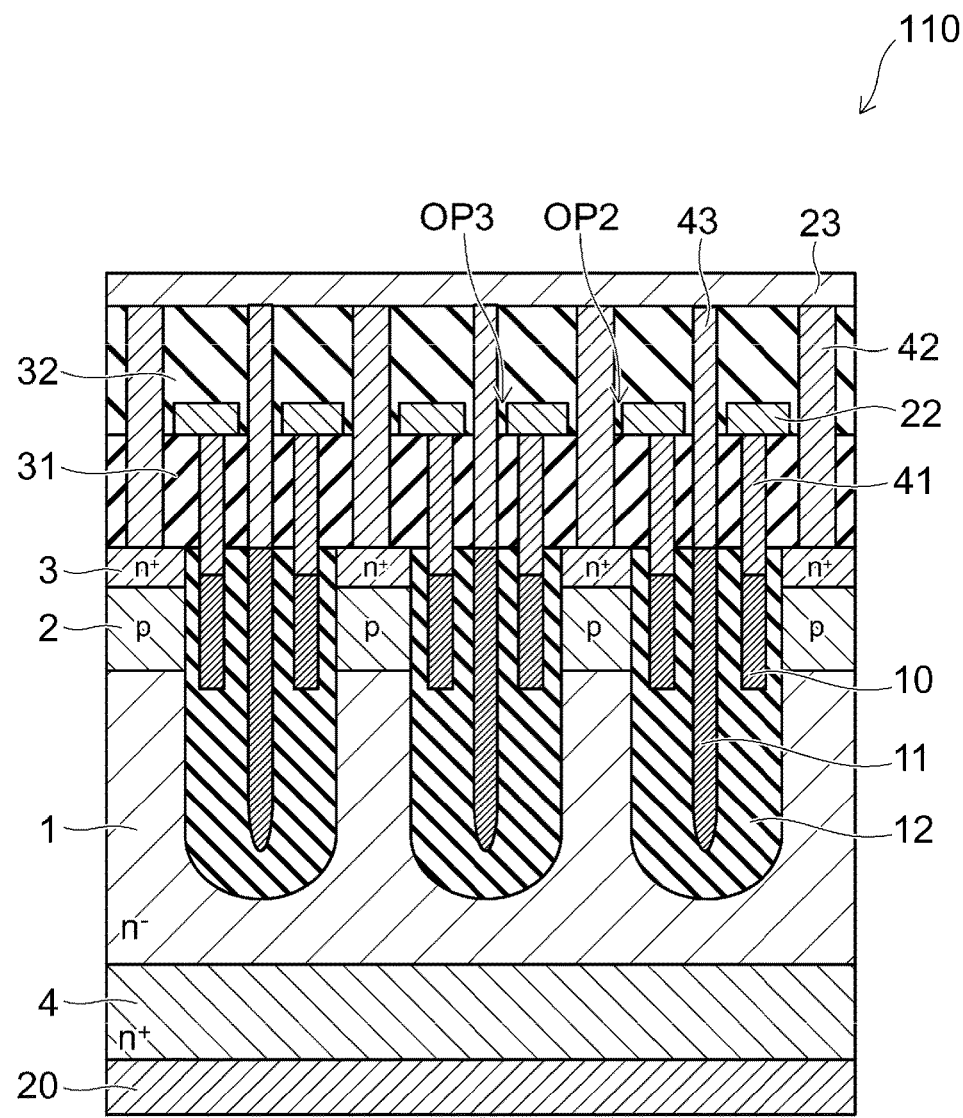
FIG. 8 is a cross sectional view illustrating a part of a semiconductor device according to a first modification example of the first embodiment.

FIG. 8 is a cross sectional view illustrating a portion of a semiconductor device 110 according to a first modification example of the first embodiment.

As illustrated in FIG. 8, a semiconductor device 110 does not have a source electrode 21 provided therein.

In addition to the plug 42, a plug 43 is provided in the insulating layer 31 and the insulating layer 32.

The gate pad 22 includes a plurality of openings OP2 and a plurality of openings OP3.

The plug 42 directly connects the source pad 23 and the $n^+$ type source region 3 through the openings OP2. Further, the plug 43 directly connects the source pad 23 and the FP electrodes 11 through the openings OP3.

Compared to the semiconductor device 100, the semiconductor device according to the modification example does not have the source electrode 21 provided therein such that the opposed area between the metal layer connected to the source potential and the metal layer connected to the gate potential can be smaller.

Accordingly, compared to the semiconductor device 100, the modification example can reduce gate-source capacitances and shorten a switching time of the semiconductor device.

Second Modification Example

Figure 9:
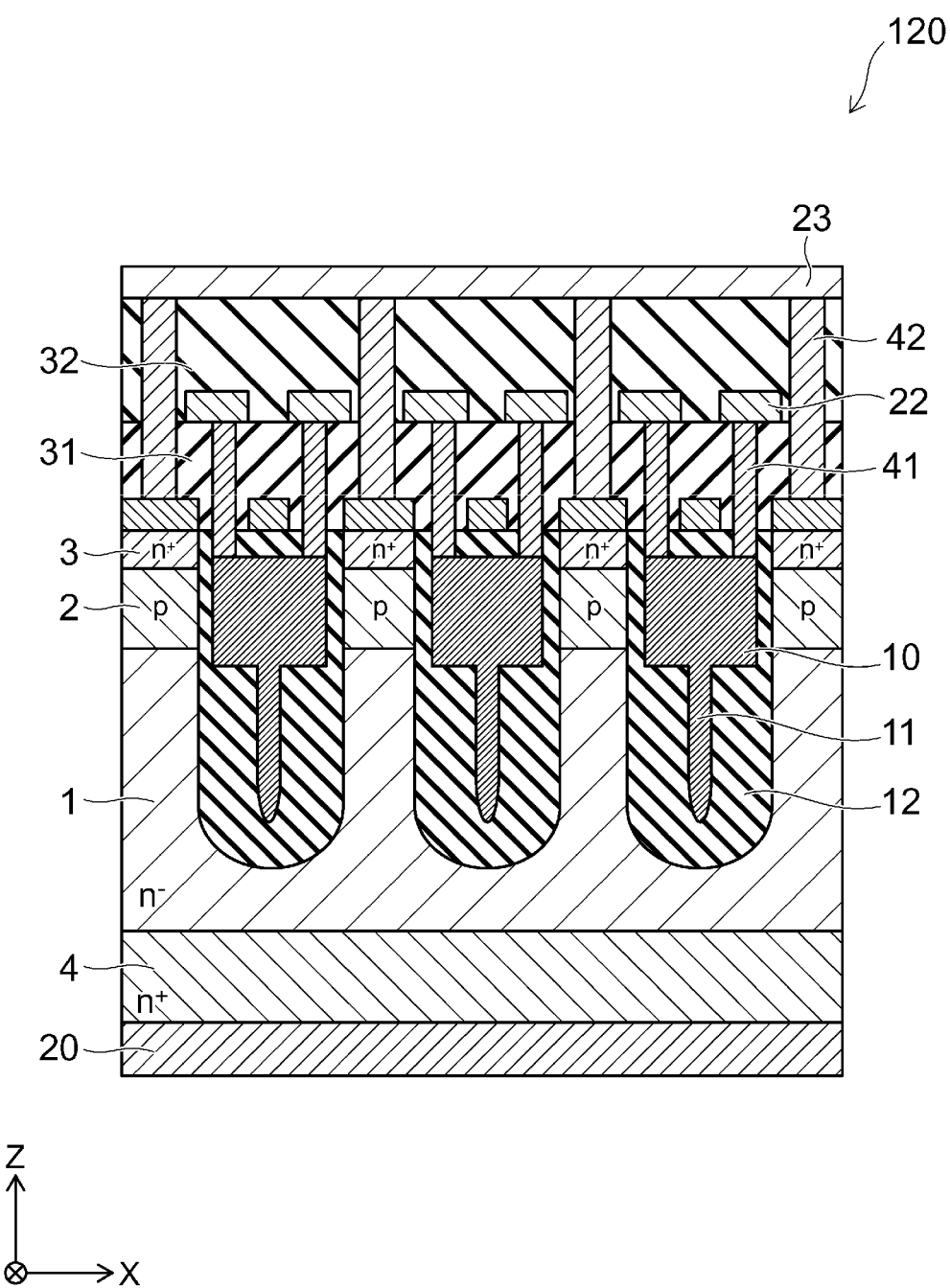
FIG. 9 is a cross sectional view illustrating a part of a semiconductor device according to a second modification example of the first embodiment.

FIG. 9 is a cross sectional view illustrating a portion of a semiconductor device 120 according to a second modification example of the first embodiment.

In the semiconductor device 120, as illustrated in FIG. 9, the gate electrodes 10 and the FP electrodes 11 are integrally formed with each other. That is, in the semiconductor device 100 the FP electrodes 11 are connected to the source potential, whereas in the semiconductor device 120 the FP electrodes 11 are connected to the gate potential.

Even in this case, when the semiconductor device 120 is in the off state, the potential difference between the drain electrode 20 and the gate electrodes 10 causes the depletion layer to expand from the interface between the insulating portion 12 and the $n^-$ type semiconductor region 1 into the $n^-$ type semiconductor region 1.

As a result, similarly to the case of the semiconductor device 100, the modification example also can allow and increase the n type impurity concentration in the $n^-$ type semiconductor region 1, and the channel density of the semiconductor device can be enhanced and the on resistance of the semiconductor device can be reduced.

Second Embodiment

Figure 10:
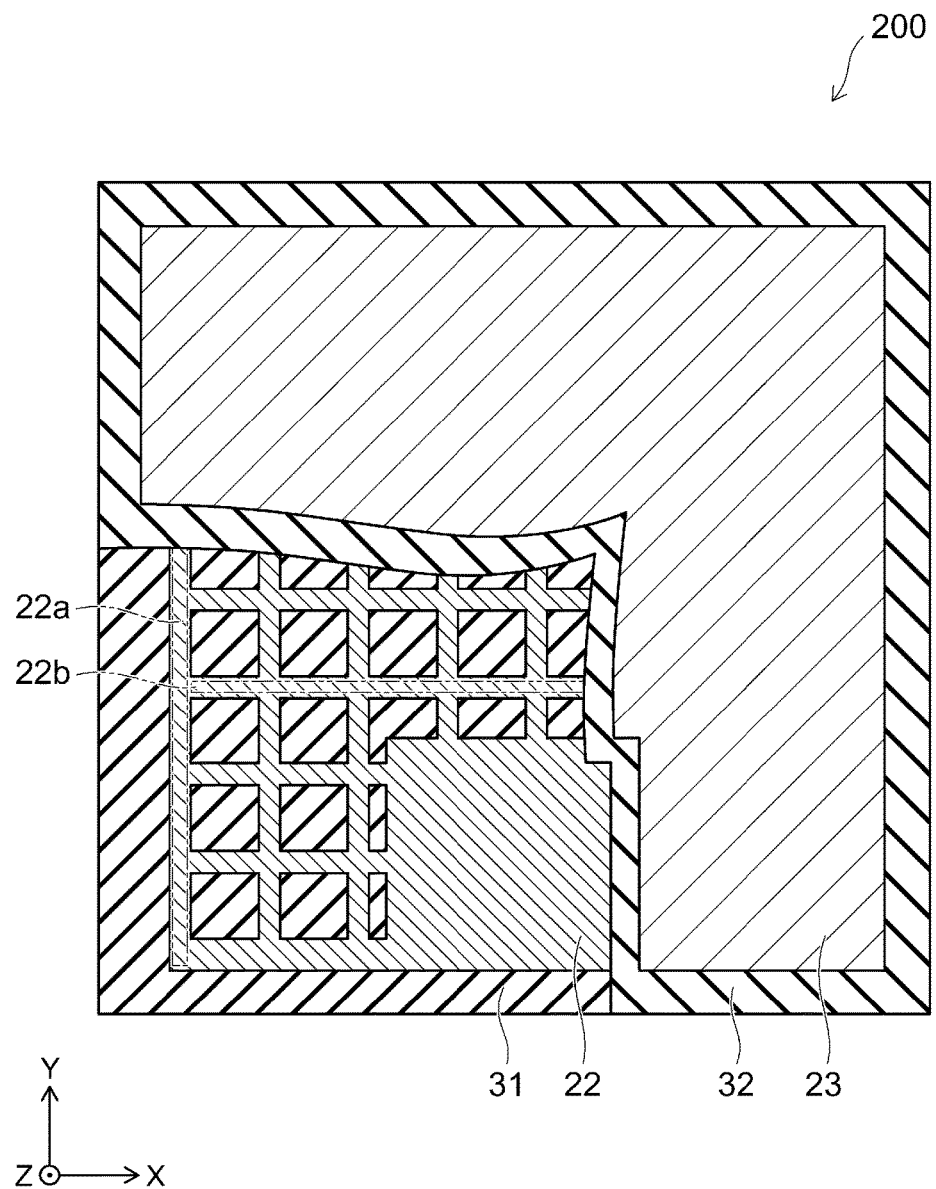
FIG. 10 is a top view illustrating a semiconductor device according to a second embodiment.
Figure 11:
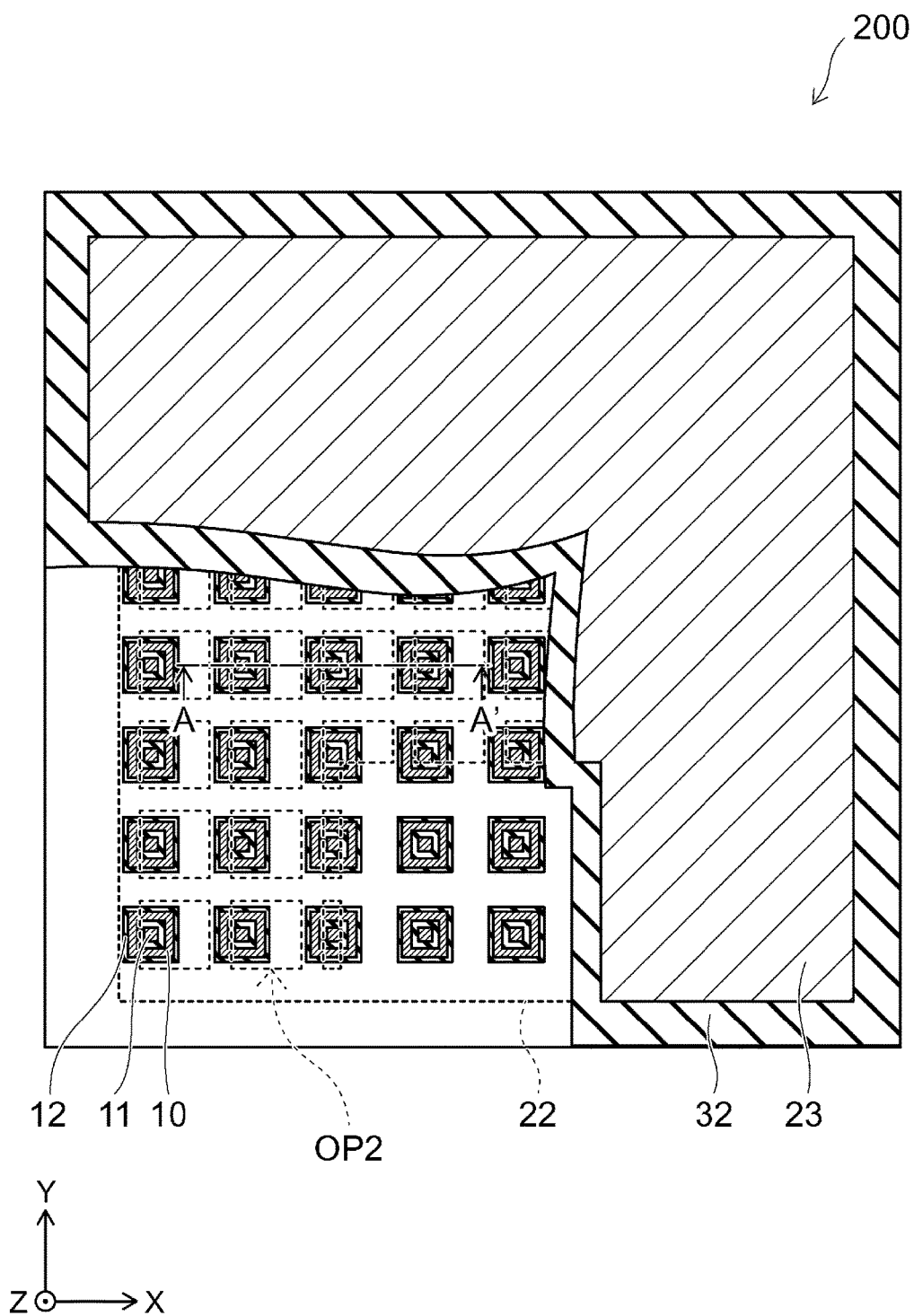
FIG. 11 is a top view illustrating the semiconductor device according to the second embodiment.

FIGS. 10 and 11 are top views illustrating a semiconductor device 200 according to a second embodiment.

Figure 12:
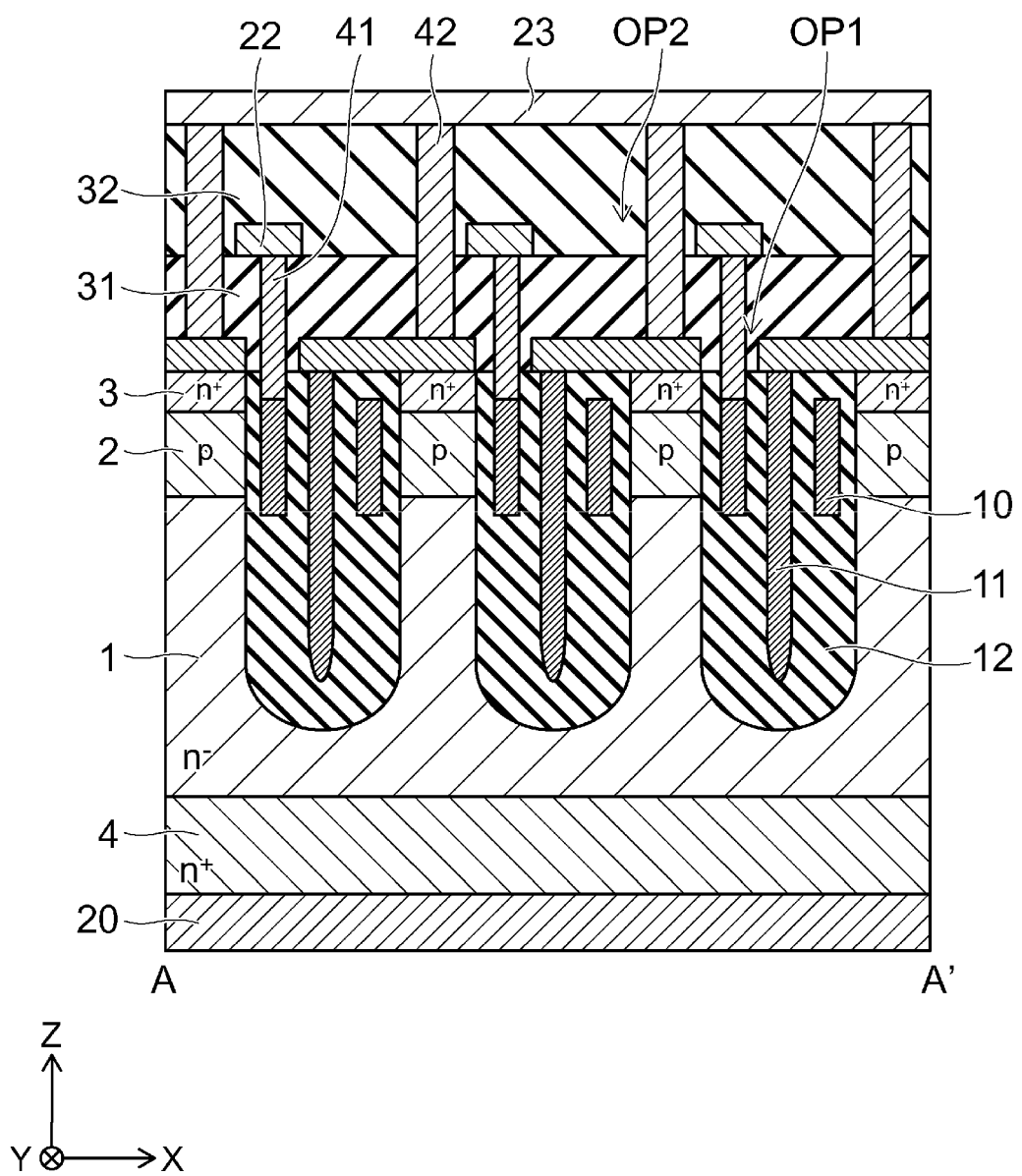
FIG. 12 is a cross sectional view cut along line A-A' of FIG. 11.

FIG. 12 is a cross sectional view taken along line A-A' of FIG. 11.

In FIG. 10, parts of the insulating layer 32 and the source pad 23 are not illustrated.

In FIG. 11, parts of the source electrode 21, insulating layer 31, insulating layer 32, and source pad 23 are omitted, and the gate pad 22 are indicated by broken lines.

As illustrated in FIG. 10, in the semiconductor device 200 according to this embodiment, a part of the gate pad 22 covered by the source pad 23 is formed in lattice shape.

More specifically, the gate pad 22 has a first portion 22a extending in the Y direction, and a second portion 22b extending in the X direction. The plurality of first portions 22a are spaced apart in the X direction, and the plurality of second portion 22b are spaced apart in the Y direction. These portions are arranged to intersect with each other, and thus a portion of the gate pad 22 is formed in a lattice shape.

As illustrated in FIG. 11, a portion of the gate electrodes 10 are located below each of the first portions 22a.

As illustrated in FIG. 12, the plug 41 is provided between the gate electrodes 10 and the first portion 22a in the Z direction, connecting the first portion 22a and the gate electrodes 10.

In addition, the plug 42 connects the source pad 23 and the source electrode 21 through the openings OP2 formed by the lattice shape of the first portion 22a and the second portion 22b.

In this embodiment, by forming a portion of the gate pad 22 in a lattice shape, it is possible to reduce the opposed area between the gate pad 22 and the source electrode 21, and the opposed area between the gate pad 22 and the source pad 23.

That is, according to this embodiment, the gate-source capacitance can be reduced and the switching time of the semiconductor device can be shortened, compared to the semiconductor device 100 according to the first embodiment.

Further, according to this embodiment, the source electrode 21 is provided on the $n^+$ type source region 3 as in the semiconductor device 100. Accordingly, this embodiment allows a greater current to flow in the semiconductor device than the semiconductor device 110 according to the first modification example of the first embodiment, while suppressing an increase of gate-source capacitance.

Since the gate pad 22 has the first portion 22a and the second portion 22b extending in different directions from each other, the electrical resistance at the gate pad 22 can be reduced. As a result, it is possible to reduce the delay in the speed of delivering a signal to the respective gate electrodes 10 when the gate voltage is applied to the gate pad 22.

While FIGS. 10 to 12 illustrate examples where the first portion 22a and the gate electrodes 10 are connected by the plug 41, the present embodiment is not limited to any specific examples. For example, the second portion 22b and the gate electrodes 10 may be connected by the plug 41. Alternatively, the semiconductor device 200 may have more plugs 41 such that both the first portion 22a and the second portion 22b are connected to the gate electrodes 10.

Further, the gate pad 22 may include only one of the first portion 22a or the second portion 22b such that one of the first portion 22a and the second portion 22b is connected to the gate electrodes 10. By employing such configuration, the gate-source capacitance can further be reduced in the semiconductor device.

In various embodiments described above, it is possible to check the relative levels of the impurity concentrations in the respective semiconductor regions with, for example, the scanning capacitance microscopy (SCM). Further, the carrier concentration of the respective semiconductor regions may be regarded to be identical to the concentration of the activated conductivity type impurities (dopants) in the respective semiconductor regions. Accordingly, the relative levels of the carrier concentration among the respective semiconductor regions can be checked also with the SCM.

In addition, the impurity concentration in the respective semiconductor regions may be measured with, for example, secondary ion mass spectroscopy (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, the detailed configurations of the respective elements, such as the n⁻ type semiconductor region 1, p type base region 2, n⁺ type source region 3, n⁺ type drain region 4, gate electrodes 10, FP electrodes 11, insulating portion 12, drain electrode 20, source electrode 21, gate pad 22, source pad 23, insulating layer 31, insulating layer 32, plug 41, and the plug 42, which are included in the embodiments can be appropriately selected from known technologies by those skilled in the art. The embodiments of these elements or modifications are included in the scope and the gist of the invention and are included in the invention described in the claims and their equivalents. The above-described embodiments can be combined with each other to be carried out.

What is claimed is:

1. A semiconductor device, comprising:
   a first semiconductor region of a first conductivity type;
   a second semiconductor region of a second conductivity type on the first semiconductor region;
   a third semiconductor region of the first conductivity type on the second semiconductor region;
   a first insulating portion extending inwardly of, and surrounded by, the first semiconductor region, the second semiconductor region, and the third semiconductor region;
   a gate electrode extending inwardly of the first insulating portion;
   a first electrode extending inwardly of the first insulating portion and surrounded by the first insulating portion and the gate electrode;
   a first metal layer on the third semiconductor region and the first insulating portion, and electrically connected to the third semiconductor region;
   a first insulating layer on the first metal layer;
   a second metal layer on the first insulating layer;
   a second insulating layer on the second metal layer;
   a third metal layer on the second insulating layer; and
   a first connection portion extending through the first insulating layer and the second insulating layer to connect the first metal layer and the third metal layer.

2. The semiconductor device of claim 1, wherein the first electrode extends further inwardly of the first insulating portion than the gate electrode.

3. The semiconductor device of claim 1, further comprising:
   a second connection portion provided in the first insulating layer,
   wherein the first metal layer includes a first opening, and
   the second connection portion extends through the first opening to connect the second metal layer and the gate electrode.

4. The semiconductor device of claim 3,
   wherein the second metal layer includes a second opening, and
   the first connection portion extends through the second opening.

5. The semiconductor device of claim 4,
   wherein the second metal layer includes a first portion extending in the second direction, and
   the second connection portion connects the first portion and the gate electrode through the first opening.

6. The semiconductor device of claim 1,
   wherein a plurality of the first insulating portions, a plurality of the gate electrodes, and a plurality of the first electrodes are provided in a second direction and in a third direction, which intersects the first and second directions,
   the plurality of gate electrodes are surrounded by the plurality of first insulating portions, respectively, and
   each of the plurality of first electrodes is surrounded by a respective one of the first insulating portions and a respective one of the gate electrodes.

* * * * *